US011990507B2

(12) United States Patent
Chen et al.

(10) Patent No.: US 11,990,507 B2
(45) Date of Patent: May 21, 2024

(54) HIGH VOLTAGE TRANSISTOR STRUCTURE

(71) Applicant: United Microelectronics Corp., Hsinchu (TW)

(72) Inventors: Chin-Hung Chen, Tainan (TW); Ssu-I Fu, Kaohsiung (TW); Chih-Kai Hsu, Tainan (TW); Chun-Ya Chiu, Tainan (TW); Chia-Jung Hsu, Tainan (TW); Yu-Hsiang Lin, New Taipei (TW)

(73) Assignee: United Microelectronics Corp., Hsinchu (TW)

( * ) Notice: Subject to any disclaimer, the term of this patent is extended or adjusted under 35 U.S.C. 154(b) by 127 days.

(21) Appl. No.: 17/403,578

(22) Filed: Aug. 16, 2021

(65) Prior Publication Data
US 2023/0047580 A1    Feb. 16, 2023

(51) Int. Cl.
*H01L 29/06* (2006.01)
*H01L 29/10* (2006.01)
*H01L 29/78* (2006.01)

(52) U.S. Cl.
CPC ...... *H01L 29/0653* (2013.01); *H01L 29/1095* (2013.01); *H01L 29/7816* (2013.01)

(58) Field of Classification Search
CPC ............. H01L 39/0653; H01L 39/1095; H01L 39/7816; H01L 39/7835
USPC .......................................................... 257/343
See application file for complete search history.

(56) References Cited

U.S. PATENT DOCUMENTS

| 8,159,029 | B2 | 4/2012 | Su et al. |
| 8,643,101 | B2 | 2/2014 | Kao et al. |
| 10,276,710 | B1* | 4/2019 | Li ..................... H01L 29/42356 |
| 2013/0043513 | A1* | 2/2013 | Huang ................ H01L 29/7816 |
| | | | 257/E21.546 |
| 2020/0279915 | A1* | 9/2020 | Sun ..................... H01L 29/7835 |
| 2022/0199459 | A1* | 6/2022 | Fang ................. H01L 21/76232 |

* cited by examiner

*Primary Examiner* — Fazli Erdem
(74) *Attorney, Agent, or Firm* — J.C. PATENTS

(57) ABSTRACT

A high voltage transistor structure including a substrate, a first isolation structure, a second isolation structure, a gate structure, a first source and drain region, and a second source and drain region is provided. The first isolation structure and the second isolation structure are disposed in the substrate. The gate structure is disposed on the substrate, at least a portion of the first isolation structure, and at least a portion of the second isolation structure. The first source and drain region and the second source and drain region are located in the substrate on two sides of the first isolation structure and the second isolation structure. The depth of the first isolation structure is greater than the depth of the second isolation structure.

20 Claims, 1 Drawing Sheet

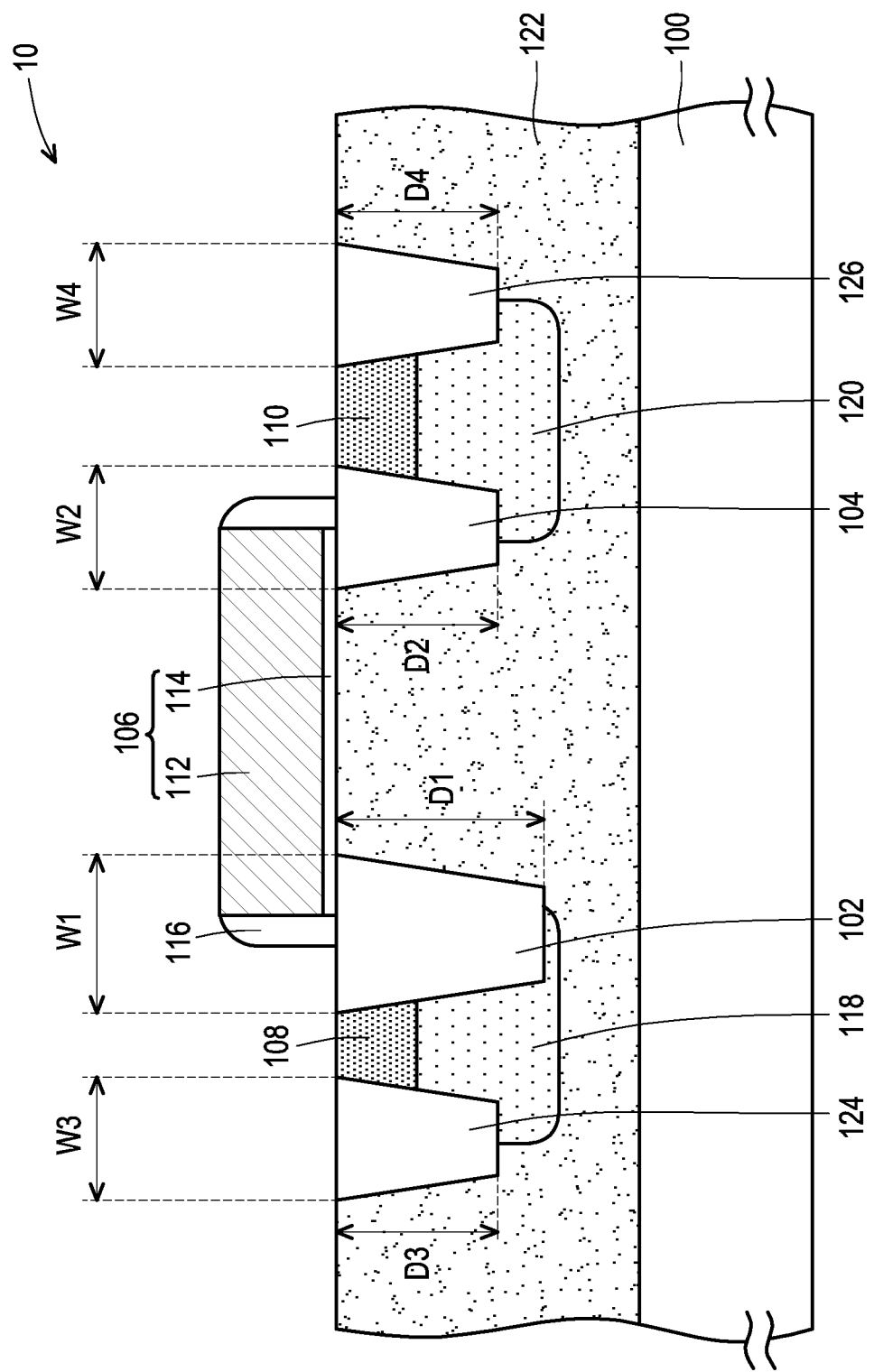

HIGH VOLTAGE TRANSISTOR STRUCTURE

BACKGROUND OF THE INVENTION

Field of the Invention

The invention relates to a semiconductor structure, and particularly relates to a high voltage transistor structure.

Description of Related Art

Currently, the high voltage transistor device is widely used in various electronic products. With the advancement of science and technology, the size of the electronic device continues to shrink, so it becomes more difficult to increase the breakdown voltage of the high voltage transistor device. Therefore, how to increase the breakdown voltage of the high voltage transistor device is the goal of continuous efforts.

SUMMARY OF THE INVENTION

The invention provides a high voltage transistor structure, which can increase the breakdown voltage of the high voltage transistor device.

The invention provides a high voltage transistor structure, which includes a substrate, a first isolation structure, a second isolation structure, a gate structure, a first source and drain region, and a second source and drain region. The first isolation structure and the second isolation structure are disposed in the substrate. The gate structure is disposed on the substrate, at least a portion of the first isolation structure, and at least a portion of the second isolation structure. The first source and drain region and the second source and drain region are located in the substrate on two sides of the first isolation structure and the second isolation structure. The depth of the first isolation structure is greater than the depth of the second isolation structure.

According to an embodiment of the invention, in the high voltage transistor structure, the width of the first isolation structure may be greater than the width of the second isolation structure.

According to an embodiment of the invention, the high voltage transistor structure may further include a third isolation structure. The third isolation structure is disposed in the substrate. The first source and drain region is located between the first isolation structure and the third isolation structure.

According to an embodiment of the invention, in the high voltage transistor structure, the depth of the first isolation structure may be greater than the depth of the third isolation structure.

According to an embodiment of the invention, in the high voltage transistor structure, the width of the first isolation structure may be greater than the width of the third isolation structure.

According to an embodiment of the invention, the high voltage transistor structure may further include a fourth isolation structure. The fourth isolation structure is disposed in the substrate. The second source and drain region is located between the second isolation structure and the fourth isolation structure.

According to an embodiment of the invention, in the high voltage transistor structure, the depth of the first isolation structure may be greater than the depth of the fourth isolation structure.

According to an embodiment of the invention, in the high voltage transistor structure, the width of the first isolation structure may be greater than the width of the fourth isolation structure.

According to an embodiment of the invention, in the high voltage transistor structure, the gate structure may include a gate and a dielectric layer. The gate is disposed on the substrate. The dielectric layer is located between the gate and the substrate.

According to an embodiment of the invention, the high voltage transistor structure may further include a spacer. The spacer is located on the sidewall of the gate.

According to an embodiment of the invention, the high voltage transistor structure may further include a first well region, a second well region, and a third well region. The first well region is located in the substrate. The first source and drain region is located in the first well region. The second well region is located in the substrate. The second source and drain region is located in the second well region. The third well region is located in the substrate. The first well region and the second well region are located in the third well region.

The invention provides another high voltage transistor structure, which includes a substrate, a first isolation structure, a second isolation structure, a gate structure, a first source and drain region, and a second source and drain region. The first isolation structure and the second isolation structure are disposed in the substrate. The gate structure is disposed on the substrate, at least a portion of the first isolation structure, and at least a portion of the second isolation structure. The first source and drain region and the second source and drain region are located in the substrate on two sides of the first isolation structure and the second isolation structure. The width of the first isolation structure is greater than the width of the second isolation structure.

According to another embodiment of the invention, the high voltage transistor structure may further include a third isolation structure. The third isolation structure is disposed in the substrate. The first source and drain region is located between the first isolation structure and the third isolation structure.

According to another embodiment of the invention, in the high voltage transistor structure, the depth of the first isolation structure may be greater than the depth of the third isolation structure.

According to another embodiment of the invention, in the high voltage transistor structure, the width of the first isolation structure may be greater than the width of the third isolation structure.

According to another embodiment of the invention, the high voltage transistor structure may further include a fourth isolation structure. The fourth isolation structure is disposed in the substrate. The second source and drain region is located between the second isolation structure and the fourth isolation structure.

According to another embodiment of the invention, in the high voltage transistor structure, the depth of the first isolation structure may be greater than the depth of the fourth isolation structure.

According to another embodiment of the invention, in the high voltage transistor structure, the width of the first isolation structure may be greater than the width of the fourth isolation structure.

According to another embodiment of the invention, in the high voltage transistor structure, the gate structure may include a gate and a dielectric layer. The gate is disposed on the substrate. The dielectric layer is located between the gate and the substrate.

According to another embodiment of the invention, the high voltage transistor structure may further include a first well region, a second well region, and a third well region. The first well region is located in the substrate. The first source and drain region is located in the first well region. The second well region is located in the substrate. The second source and drain region is located in the second well region. The third well region is located in the substrate. The first well region and the second well region are located in the third well region.

Based on the above description, in the high voltage transistor structure according to an embodiment of the invention, since the depth of the first isolation structure is greater than the depth of the second isolation structure, the breakdown voltage of the high voltage transistor device can be increased. Moreover, in the high voltage transistor structure according to another embodiment of the invention, since the width of the first isolation structure is greater than the width of the second isolation structure, the breakdown voltage of the high voltage transistor device can be increased. Furthermore, the breakdown voltage of the high voltage transistor device can be flexibly adjusted by tuning the depth and/or width of the first isolation structure.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a cross-sectional view illustrating a high voltage transistor structure according to an embodiment of the invention.

DESCRIPTION OF THE EMBODIMENTS

FIG. 1 is a cross-sectional view illustrating a high voltage transistor structure according to an embodiment of the invention.

Referring to FIG. 1, a high voltage transistor structure 10 includes a substrate 100, an isolation structure 102, an isolation structure 104, a gate structure 106, a source and drain region 108, and a source and drain region 110. In some embodiments, the high voltage transistor structure 10 may be a field drift metal oxide semiconductor (FDMOS) transistor. The substrate 100 may be a semiconductor substrate such as a silicon substrate.

The isolation structure 102 and the isolation structure 104 are disposed in the substrate 100. The isolation structure 104 may be located on one side of the isolation structure 102. In some embodiments, the isolation structure 102 may be a shallow trench isolation (STI) structure. The material of the isolation structure 102 is, for example, silicon oxide. In some embodiments, the isolation structure 104 may be an STI structure. The material of the isolation structure 104 is, for example, silicon oxide.

In some embodiments, the depth D1 of the isolation structure 102 is greater than the depth D2 of the isolation structure 104, thereby increasing the breakdown voltage of the high voltage transistor device. In some embodiments, the width W1 of the isolation structure 102 is greater than the width W2 of the isolation structure 104, thereby increasing the breakdown voltage of the high voltage transistor device. In some embodiments, the depth D1 of the isolation structure 102 is greater than the depth D2 of the isolation structure 104, and the width W1 of the isolation structure 102 is greater than the width W2 of the isolation structure 104, thereby increasing the breakdown voltage of the high voltage transistor device. Furthermore, the breakdown voltage of the high voltage transistor device can be flexibly adjusted by tuning the depth D1 and/or width W1 of the isolation structure 102. In some embodiments, the size of the isolation structure 102 and the size of the isolation structure 104 are asymmetric. For example, the size of the isolation structure 102 may be greater than the size of the isolation structure 104. As long as "the depth D1 of the isolation structure 102 is greater than the depth D2 of the isolation structure 104" or "the width W1 of the isolation structure 102 is greater than the width W2 of the isolation structure 104" is satisfied, it falls within the scope of the invention.

The gate structure 106 is disposed on the substrate 100, at least a portion of the isolation structure 102, and at least a portion of the isolation structure 104. The gate 112 structure 106 may include a gate 112 and a dielectric layer 114. The gate 112 is disposed on the substrate 100. The material of the gate 112 is, for example, doped polysilicon. The dielectric layer 114 is located between the gate 112 and the substrate 100. The material of the dielectric layer 114 is, for example, silicon oxide. The high voltage transistor structure 10 may further include a spacer 116. The spacer 116 is located on the sidewall of the gate 112. The spacer 116 may be a single-layer structure or a multilayer structure. The material of the spacer 116 is, for example, silicon oxide, silicon nitride, or a combination thereof.

The source and drain region 108 and the source and drain region 110 are located in the substrate 100 on two sides of the isolation structure 102 and the isolation structure 104. That is, the isolation structure 102 and the isolation structure 104 may be located between the source and drain region 108 and the source and drain region 110. In some embodiments, the high voltage (VDD) is applied to the source and drain region 108, so the isolation structure 102 with the greater depth and/or the greater width is disposed close to the source and drain region 108. For example, when the high voltage transistor structure 10 is a P-type metal oxide semiconductor (PMOS) transistor, the high voltage (VDD) is applied to the source region (e.g., source and drain region 108), and the isolation structure 102 with the greater depth and/or the greater width is disposed close to the source region (e.g., source and drain region 108). When the high voltage transistor structure 10 is an N-type metal oxide semiconductor (NMOS) transistor, the high voltage (VDD) is applied to the drain region (e.g., source and drain region 108), and the isolation structure 102 with the greater depth and/or the greater width is disposed close to the drain region (e.g., source and drain region 108).

The high voltage transistor structure 10 may further include a well region 118, a well region 120, and a well region 122. The well region 118 is located in the substrate 100. The source and drain region 108 is located in the well region 118. The dopant concentration of the source and drain region 108 may be greater than the dopant concentration of the well region 118. The well region 120 is located in the substrate 100. The source and drain region 110 is located in the well region 120. The dopant concentration of the source and drain region 110 may be greater than the dopant concentration of the well region 120. The well region 122 is located in the substrate 100. The well region 118 and the well region 120 are located in the well region 122.

Furthermore, the source and drain region 108, the source and drain region 110, the well region 118, and the well region 120 may have a first conductive type, and the well region 122 may have a second conductive type. The first conductive type and the second conductive type are different conductive types. That is, the first conductive type and the second conductive type may be one and the other of the N-type conductive type and the P-type conductive type, respectively.

Moreover, the high voltage transistor structure 10 may further include an isolation structure 124. The isolation structure 124 is disposed in the substrate 100. The source and drain region 108 is located between the isolation structure 102 and the isolation structure 124. In some embodiments, the isolation structure 124 may be an STI structure. The material of the isolation structure 124 is, for example, silicon oxide. In some embodiments, the depth D1 of the isolation structure 102 may be greater than the depth D3 of the isolation structure 124. In some embodiments, the width W1 of the isolation structure 102 may be greater than the width W3 of the isolation structure 124. In some embodiments, the depth D1 of the isolation structure 102 may be greater than the depth D3 of the isolation structure 124, and the width W1 of the isolation structure 102 may be greater than the width W3 of the isolation structure 124.

In addition, the high voltage transistor structure 10 may further include an isolation structure 126. The isolation structure 126 is disposed in the substrate 100. The source and drain region 110 is located between the isolation structure 104 and the isolation structure 126. In some embodiments, the isolation structure 126 may be an STI structure. The material of the isolation structure 126 is, for example, silicon oxide. In some embodiments, the depth D1 of the isolation structure 102 may be greater than the depth D4 of the isolation structure 126. In some embodiments, the width W1 of the isolation structure 102 may be greater than the width W4 of the isolation structure 126. In some embodiments, the depth D1 of the isolation structure 102 may be greater than the depth D4 of the isolation structure 126, and the width W1 of the isolation structure 102 may be greater than the width W4 of the isolation structure 126.

Based on the above, in the high voltage transistor structure 10 of some embodiments, since the depth D1 of the isolation structure 102 is greater than the depth D2 of the isolation structure 104, the breakdown voltage of the high voltage transistor device can be increased. Moreover, in the high voltage transistor structure 10 of other embodiments, since the width W1 of the isolation structure 102 is greater than the width W2 of the isolation structure 104, the breakdown voltage of the high voltage transistor device can be increased. Furthermore, the breakdown voltage of the high voltage transistor device can be flexibly adjusted by tuning the depth D1 and/or width W1 of the isolation structure 102.

In summary, the high voltage transistor structure in the above embodiments can increase the breakdown voltage of the high voltage transistor device and can flexibly adjust the breakdown voltage of the high voltage transistor device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A high voltage transistor structure, comprising:
   a substrate;
   a first isolation structure and a second isolation structure disposed in the substrate;
   a gate structure disposed on the substrate, at least a portion of the first isolation structure, and at least a portion of the second isolation structure;
   a first source and drain region and a second source and drain region located in the substrate on two sides of the first isolation structure and the second isolation structure;
   a first well region located in the substrate, wherein the first source and drain region is located in the first well region; and
   a second well region located in the substrate, wherein the second source and drain region is located in the second well region, wherein
   a depth of the first isolation structure is greater than a depth of the second isolation structure,
   the gate structure is located directly above at least a portion of the first isolation structure and at least a portion of the second isolation structure, and
   the first well region and the second well region are not located between the first isolation structure and the second isolation structure.

2. The high voltage transistor structure according to claim 1, wherein a width of the first isolation structure is greater than a width of the second isolation structure.

3. The high voltage transistor structure according to claim 1, further comprising:
   a third isolation structure disposed in the substrate, wherein the first source and drain region is located between the first isolation structure and the third isolation structure.

4. The high voltage transistor structure according to claim 3, wherein the depth of the first isolation structure is greater than a depth of the third isolation structure.

5. The high voltage transistor structure according to claim 3, wherein a width of the first isolation structure is greater than a width of the third isolation structure.

6. The high voltage transistor structure according to claim 1, further comprising:
   a fourth isolation structure disposed in the substrate, wherein the second source and drain region is located between the second isolation structure and the fourth isolation structure.

7. The high voltage transistor structure according to claim 6, wherein the depth of the first isolation structure is greater than a depth of the fourth isolation structure.

8. The high voltage transistor structure according to claim 6, wherein a width of the first isolation structure is greater than a width of the fourth isolation structure.

9. The high voltage transistor structure according to claim 1, wherein the gate structure comprises:
   a gate disposed on the substrate; and
   a dielectric layer located between the gate and the substrate.

10. The high voltage transistor structure according to claim 9, further comprising:
    a spacer located on a sidewall of the gate.

11. The high voltage transistor structure according to claim 1, further comprising:

a third well region located in the substrate, wherein the first well region and the second well region are located in the third well region.

12. A high voltage transistor structure, comprising:
a substrate;
a first isolation structure and a second isolation structure disposed in the substrate;
a gate structure disposed on the substrate, at least a portion of the first isolation structure, and at least a portion of the second isolation structure;
a first source and drain region and a second source and drain region located in the substrate on two sides of the first isolation structure and the second isolation structure;
a first well region located in the substrate, wherein the first source and drain region is located in the first well region; and
a second well region located in the substrate, wherein the second source and drain region is located in the second well region, wherein
a width of the first isolation structure is greater than a width of the second isolation structure,
the gate structure is located directly above at least a portion of the first isolation structure and at least a portion of the second isolation structure, and
the first well region and the second well region are not located between the first isolation structure and the second isolation structure.

13. The high voltage transistor structure according to claim 12, further comprising:
a third isolation structure disposed in the substrate, wherein the first source and drain region is located between the first isolation structure and the third isolation structure.

14. The high voltage transistor structure according to claim 13, wherein a depth of the first isolation structure is greater than a depth of the third isolation structure.

15. The high voltage transistor structure according to claim 13, wherein the width of the first isolation structure is greater than a width of the third isolation structure.

16. The high voltage transistor structure according to claim 12, further comprising:
a fourth isolation structure disposed in the substrate, wherein the second source and drain region is located between the second isolation structure and the fourth isolation structure.

17. The high voltage transistor structure according to claim 16, wherein a depth of the first isolation structure is greater than a depth of the fourth isolation structure.

18. The high voltage transistor structure according to claim 16, wherein the width of the first isolation structure is greater than a width of the fourth isolation structure.

19. The high voltage transistor structure according to claim 12, wherein the gate structure comprises:
a gate disposed on the substrate; and
a dielectric layer located between the gate and the substrate.

20. The high voltage transistor structure according to claim 12, further comprising:
a third well region located in the substrate, wherein the first well region and the second well region are located in the third well region.

* * * * *